United States Patent
Chang et al.

(10) Patent No.: US 6,801,462 B2
(45) Date of Patent: Oct. 5, 2004

(54) DEVICE AND METHOD FOR DETECTING ALIGNMENT OF DEEP TRENCH CAPACITORS AND WORD LINES IN DRAM DEVICES

(75) Inventors: Ming Cheng Chang, Taoyuan Hsien (TW); Jeng-Ping Lin, Taoyuan Hsien (TW); Tie Jiang Wu, Ilan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/612,857

(22) Filed: Jul. 3, 2003

(65) Prior Publication Data

US 2004/0076056 A1 Apr. 22, 2004

(30) Foreign Application Priority Data

Oct. 22, 2002 (TW) .................................. 91124327 A

(51) Int. Cl.[7] ................................................ G11C 7/00
(52) U.S. Cl. .......................... 365/201; 365/63; 365/149
(58) Field of Search ........................... 365/201, 63, 149

(56) References Cited

U.S. PATENT DOCUMENTS 6,529,427 B1 * 3/2003 Guo ............................ 365/201
6,693,834 B1 * 2/2004 Wu et al. .................... 365/201

* cited by examiner

*Primary Examiner*—Richard Elms
*Assistant Examiner*—Tuan T. Nguyen
(74) *Attorney, Agent, or Firm*—Quintero Law Office

(57) ABSTRACT

A test device and method for detecting alignment of word lines and deep trench capacitors in DRAM devices. In the test device, parallel first and second bar-type deep trenches capacitors are disposed in the scribe line region. The first and second bar-type deep trenches capacitors extend to the first and second pairs of memory cells in the memory region adjacent to the first active area respectively. The first and second bar-type deep trenches capacitors are electrically coupled to bit line contacts of the first and second pairs of memory cells respectively. First and second transistors have sources coupled to the first and second bar-type deep trenches capacitors respectively. A first bit line contact is electrically coupled to drains of the first and second transistors.

9 Claims, 4 Drawing Sheets

DEVICE AND METHOD FOR DETECTING ALIGNMENT OF DEEP TRENCH CAPACITORS AND WORD LINES IN DRAM DEVICES

BACKGROUND OF THE INVENTION

1. Field of the Invention

The present invention relates to test devices, and more particularly, to a test device for detecting alignment of deep trench capacitors and word lines in DRAM devices, as well as a test method thereof and a semiconductor device using the same.

2. Description of the Related Art

FIG. 1 is a layout of conventional deep trench capacitors in a memory device, and FIG. 2 is a cross-section of FIG. 1 along line AA. However, as shown in FIG. 2, if word line masks and deep trench capacitors are not aligned accurately, the buried strap junction A extending from the deep trench capacitor 10 may be too close to adjacent capacitors and induce a secondary leakage current. Thus, the adjacent memory cells may experience current leakage and cell failure, reducing process yield, if active area masks and deep trench capacitors are not aligned accurately.

SUMMARY OF THE INVENTION

It is therefore an object of the present invention to detect alignment of word lines and deep trench capacitors in DRAM devices.

According to the above mentioned objects, the present invention provides a test device and method for detecting alignment of word lines and deep trench capacitors in DRAM devices.

In the test device of the present invention, parallel first and second bar-type deep trenches capacitors are disposed in the scribe line region. The first and second bar-type deep trenches capacitors extend to the first and second pairs of memory cells in memory region adjacent to the first active area respectively. The first and second bar-type deep trenches capacitors are electrically coupled to bit line contacts of the first and second pairs of memory cells respectively. First and second transistors have sources coupled to the first and second bar-type deep trenches capacitors respectively. A first bit line contact is electrically coupled to drains of the first and second transistors.

According to the present invention, a method for detecting alignment of the deep trench capacitors and word lines in the DRAM devices includes the following steps. First, a wafer with at least one scribe line region and at least one memory region is provided. Then, a plurality of pairs of memory cells in the memory region and at least one test device in the scribe line region are formed simultaneously. Both the memory region and the scribe region have bit line contacts, deep trench capacitors, and word lines. A first resistance between the first bit line contact and the bit line contact of the first pair of memory cells in the test device is measured. A second resistance between the second bit line contact and the bit line contact of the second pair of memory cells in the test device is measured. Next, alignment of the first and second bar-type deep trenches capacitors and the word lines in the test device is determined according to the first resistance and the second resistance. Finally, alignment of the deep trench capacitors and word lines in the memory regions is determined according to alignment of the first and second bar-type deep trenches capacitors and word lines in the test device.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 3:
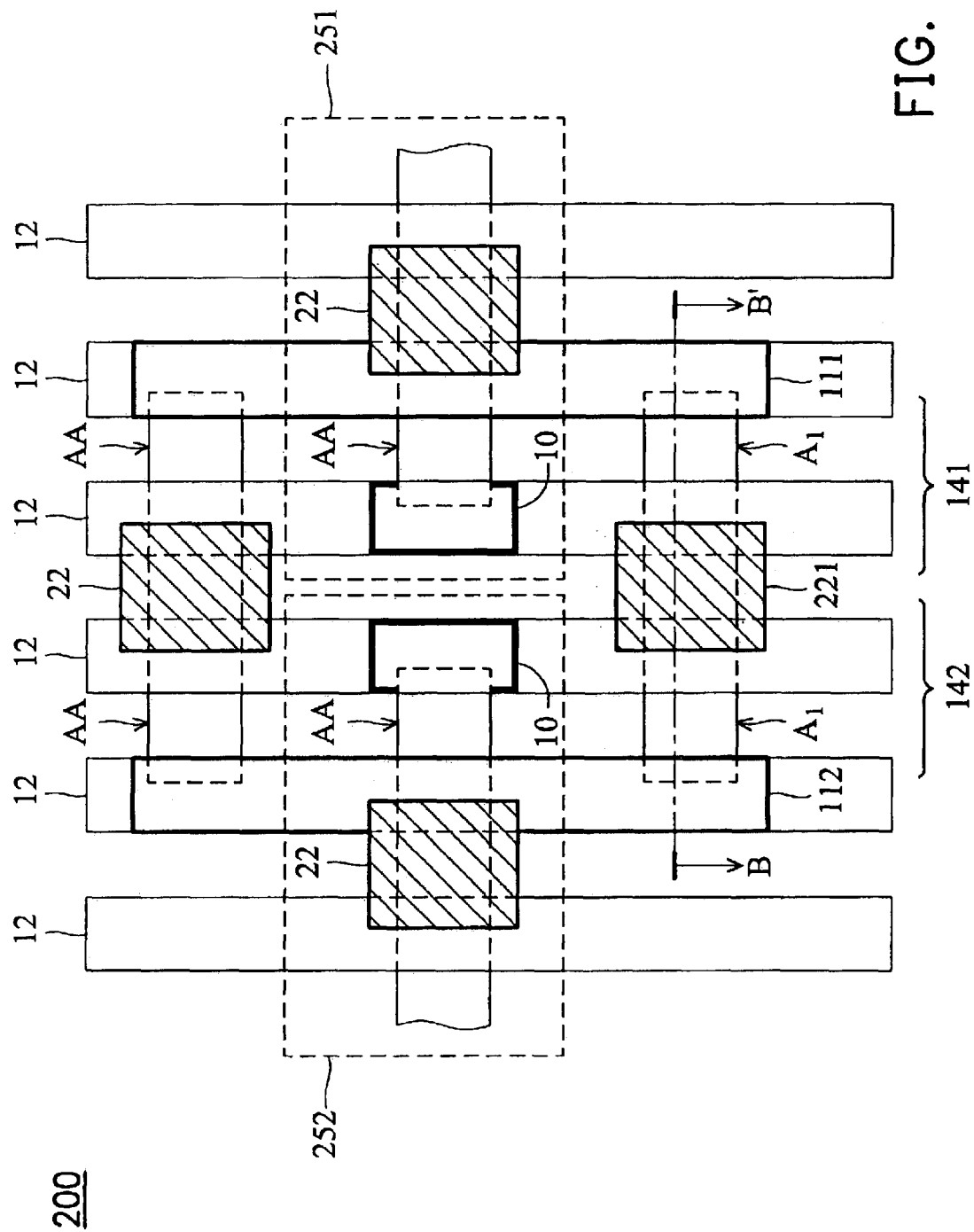
FIG. 3 is a layout of the test device according to the present invention.
Figure 4:
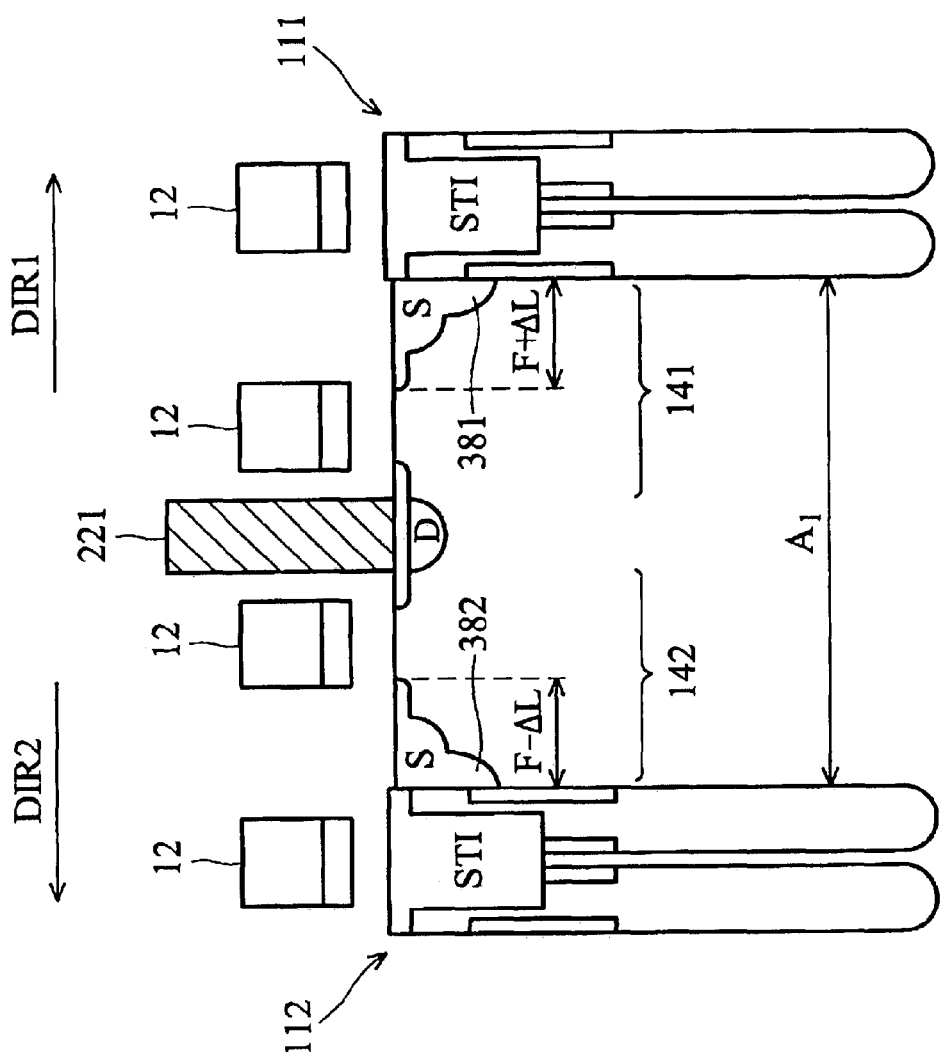
FIG. 4 is a cross section of FIG. 3.

FIG. 3 is a diagram of the device 200 for detecting alignment of deep trench capacitors and active areas in DRAM device according to the present invention. FIG. 4 is a cross section of FIG. 3. The test device 200 detects the alignment of word lines and deep trench capacitors in DRAM devices, wherein at least one test device is disposed in a scribe line region of a wafer (not shown).

Figure 1:
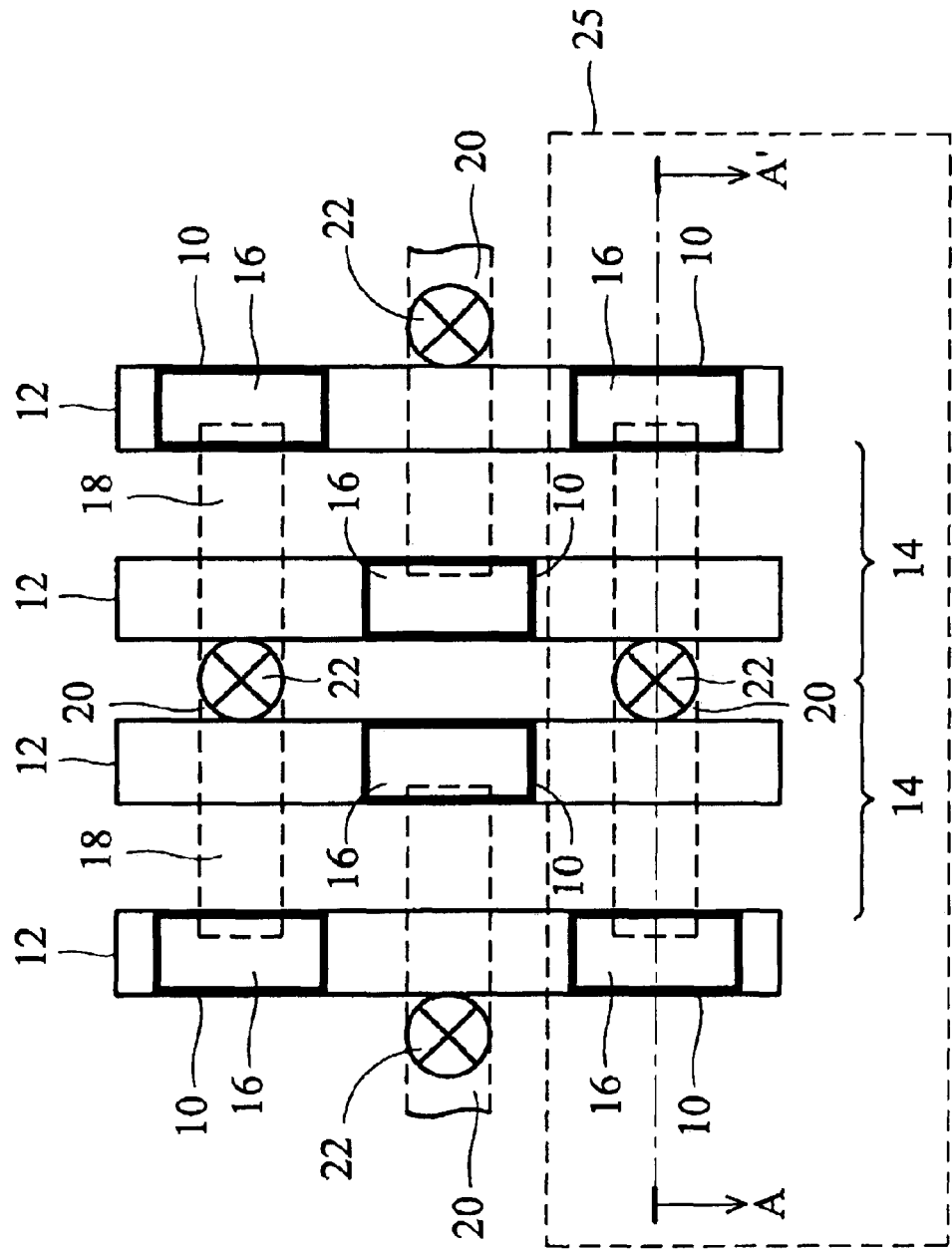
FIG. 1 is a layout of a conventional memory device with deep trench capacitors.
Figure 2:
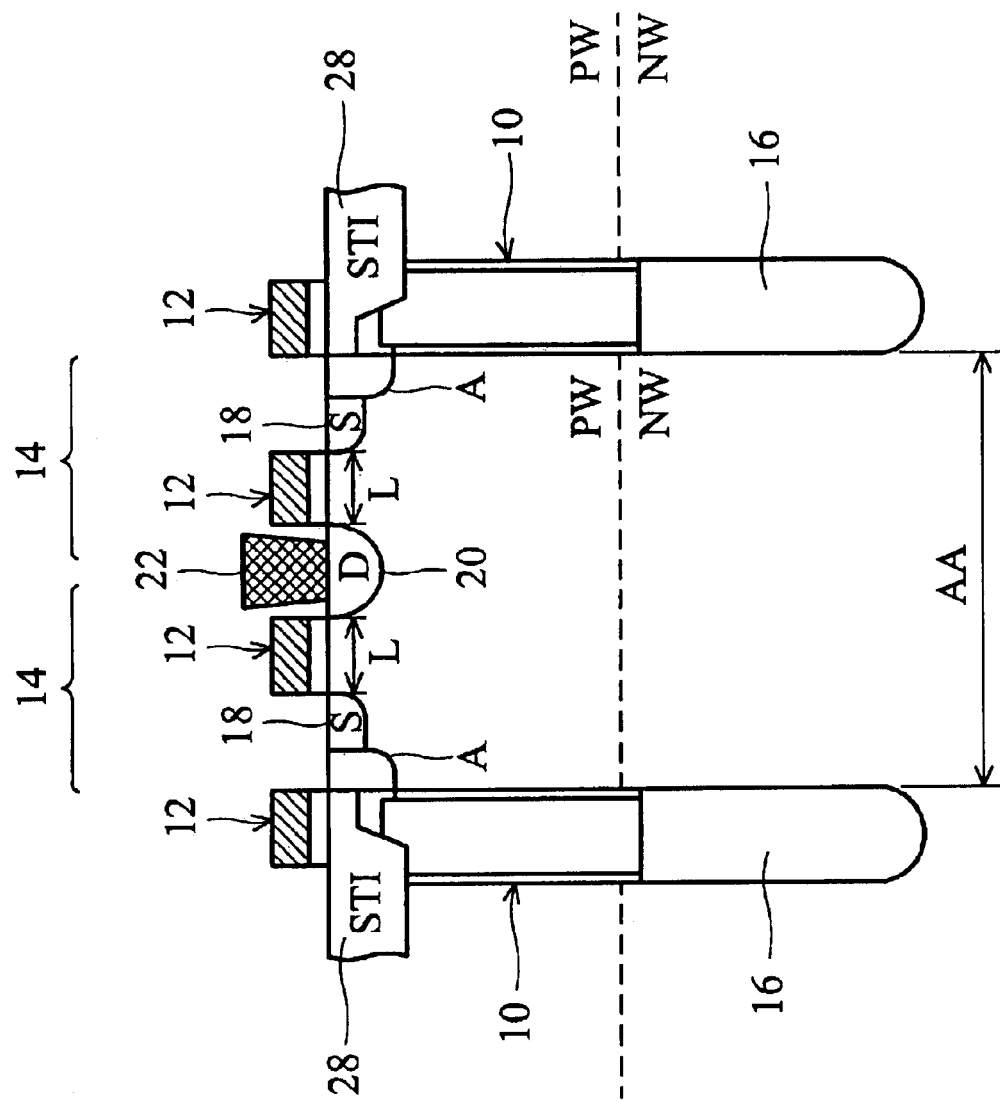
FIG. 2 is a cross section of FIG. 1.

In the present invention, a plurality of pairs of memory cells in the memory region and scribe line region and the test device 200 in the scribe line region are formed simultaneously. As shown in FIG. 1 and FIG. 2, deep trench capacitors 10 are disposed under the word lines 12, transistors 14 are electrically coupled to the corresponding storage nodes 16 of the deep trench capacitors through the diffusion regions 18. The diffusion regions 20 are connected to the bit line contacts 22 connected to bit lines (not shown) to store or write the storage nodes 16 through the transistors 14. Transistors 14 are driven by word lines 12, and the channels under the word lines may be turned on when appropriate voltages are applied to the word lines 12. Thus, current may be induced between the diffusion regions 18 and 20 to flow in and out of the storage nodes 16. In the present invention, two transistors 14, the corresponding deep trench capacitors 10, an active area AA between the two deep trench capacitors 10 and a bit line contact 22 disposed on the active area AA are defined as a pair of memory cells 25.

Typically, after the capacitors 10 are formed completely, shallow trench isolations 28 are formed in the substrate to define the active area AA. After that, word lines are formed on the substrate, wherein the shallow trench isolations 28 isolate word lines 12 and capacitors 10. The diffusion regions 18 and 20 are then formed in the active area AA as sources and drains of the transistors 14 using the word lines 12 and the shallow trench isolations 28 as masks.

FIG. 3 is a layout of the test device 200 of the present invention. The test device 200 detects the alignment of word lines and deep trench capacitors in DRAM devices with vertical transistors, wherein the test device 200 is disposed in a scribe line region of a wafer (not shown). A plurality of pairs of memory cells 251 and 252 are formed in the scribe line region, and the structure thereof is the same as that shown in FIGS. 1 and 2. For example, each pair of memory cells includes two capacitors disposed on two sides of the active area AA, two word lines disposed under the active area AA, and a bit line contact 22 disposed between the two word lines 12 and electrically connected to the active area AA thereunder.

As shown in FIG. 3, the test device 200 of the present invention includes parallel first and second bar-type deep trenches capacitors 111 and 112, a first active area $A_1$, a first transistor 141, a second transistor 141 and a bit line contact 221.

In the present invention, active areas AA in the memory region and scribe line region and an active area $A_1$ in the scribe line region are formed simultaneously with the same process and conditions.

The deep trench capacitors 10 of the plurality of pairs of memory cells in the memory region and scribe line region, and the first and second bar-type deep trenches capacitors (111 and 112) in the active area $A_1$ are formed simultaneously with the same masks, process, and conditions. The parallel first and second bar-type deep trenches capacitors 111 and 112 are disposed in the scribe line region. The first and second bar-type deep trenches capacitors 111 and 112 extend to the active areas AA of the first and second pairs of memory cells (251 and 252) adjacent to the first active area $A_1$ respectively. Further, the first and second deep trench capacitors 111 and 112 are electrically coupled to bit line contacts 22 of the first and second pairs of memory cells (251 and 252) respectively.

The word lines 12 of the plurality of pairs of memory cells in the memory regions and in the scribe line region are formed simultaneously with the same masks, process, and conditions. The first and second transistors 141 and 142 are disposed beside the first and second bar-type deep trenches capacitors 111 and 112 respectively. The first transistor 141 has a source coupled to the first bar-type deep trench capacitor 111. The second transistor 142 has a source coupled to the second bar-type deep trench capacitor 112. In addition, the bit line contacts 22 in the memory and scribe line regions, and the first bit line contact 221 of the test device are formed simultaneously with the same masks, process, and conditions. The first bit line contact 221 is disposed on the active area $A_1$ between word lines 12, and is electrically coupled to drains of the first and second transistors 141 and 142.

FIG. 4 and is a cross section of FIG. 3. In the present invention, the first and second bar-type deep trenches 111 and 112 extend to the pairs of memory cells (251 and 252) respectively. Thus, in the present invention a first resistance $R_1$ can be measured by applying a first appropriate voltage between the bit line contact 22 of the pair of memory cells 251 and the first bit line contact 221, and applying a second appropriate voltage on the word line 12 (gate of the transistor 141). Similarly, a second resistance $R_2$ can be measured by applying the first appropriate voltage between the bit line contact 22 of the pair of memory cells 252 and the first bit line contact 221, and applying a second appropriate voltage on the word line 12 (gate of the transistor 142). The first resistance $R_1$ is the resistance between the first bit line contact 221 and the bit line contact 22 of the pair of memory cells 251. The second resistance $R_2$ is the resistance between the first bit line contact 221 and the bit line contact 22 of the pair of memory cells 252. Further, the first resistance $R_1$ and second resistance $R_2$ are applicable with equations 1 and 2 as follows.

$$R_1 = Rch + R_{XA} \times \left(1 + \frac{F + \Delta L}{W}\right); \tag{1}$$

$$R_2 = Rch + R_{XA} \times \left(1 + \frac{F - \Delta L}{F}\right); \tag{2}$$

Wherein $R_{XA}$ is the resistance per surface area of the sources (381 and 382) of the transistors 141 and 142, F is the critical dimension of word lines, $F+\Delta L$ is the distance between the first bar-type deep trench capacitor 111 and the word line 12 above the transistor 141, $F-\Delta L$ is the distance between the second bar-type deep trench capacitor 112 and the word lines 12 above the transistor 142, and Rch is channel resistance of the transistors 141 and 142 when turned on.

In this case, $R_{XA}$ (resistance per surface area of the sources 381 and 382) is much larger than the channel resistance Rch when the transistors 141 and 142 are turned on, for example, larger than 3300 times Rch. Thus, equations 3 and 4 can be obtained as follows according to the equations 1 and 2.

$$\frac{R_1}{R_2} = \frac{\left(1 + \frac{F + \Delta L}{F}\right)}{\left(1 + \frac{F - \Delta L}{F}\right)}; \tag{3}$$

$$\Delta L = \frac{2F \times (R_1 - R_2)}{R_1 + R_2}; \tag{4}$$

Thus, alignment $A\Delta$ of the first and second deep trench capacitor (111 and 112) and word line 12 above the transistors 141 and 142 can be obtained according to the first resistance $R_1$, the second resistance $R_2$ and the critical dimension F of word line 12. That is to say, the alignment shift $\Delta L$ between the bar-type deep trench capacitor (111 and 112) and word line 12 above the transistors 141 and 142 is zero when the first resistance $R_1$ equals the second resistance $R_2$.

With reference to FIG. 4, for example, the word lines 12 are shifted by a distance $\Delta L$ along the direction DIR1 if the masks of the first and second bar-type deep trenches capacitors (111 and 112) and the word lines 12 have an alignment shift $\Delta L$ in the direction DIR1. If this condition is met, the first resistance $R_1$ is smaller than the second resistance $R_2$ according to the equations 1 and 2. Moreover, the alignment shift $\Delta L$ can be obtained according to the equation 4.

On the contrary, the word lines 12 are shifted by a distance $\Delta L$ along the direction DIR2 if the masks of the first and second bar-type deep trenches capacitors (111 and 112) and the word lines 12 have an alignment shift $\Delta L$ in the direction DIR2. If this condition is met, the first resistance $R_1$ is larger than the second resistance $R_2$ according to the equations 1 and 2. Moreover, the alignment shift $\Delta L$ can be obtained according to the equation 4. Thus, the present invention can obtain the first resistance $R_1$ and the second resistance $R_2$ by turning on the transistors 141 and 142 so as to obtain alignment of the bar-type deep trench capacitors (111 and 112) and the word lines of the test device 200 according to the equation 4.

In the present invention, the test device 200 disposed in the scribe line region and plurality of pairs of memory cells in the memory region and scribe line region are formed simultaneously.

For example, the deep trench capacitors 10 of the plurality of pairs of memory cells in the memory region and scribe line region, and the bar-type deep trench capacitors (111 and 112) in the test device 100 are formed simultaneously with the same masks, process, and conditions. The word lines 12 of the plurality of pairs of memory cells in the memory and scribe line regions are formed simultaneously with the same masks, process, and conditions. The bit line contacts 22 in the memory and scribe line regions, and the first bit line contact 221 of the test device, are formed simultaneously with the same masks, process, and conditions.

Therefore, the memory region and the test device may have the same alignment shift between deep trench capacitors (12, 111 and 112) and word lines 12 due to use of the same masks and process. Thus, alignment of deep trench capacitors and word lines in memory region can be obtained according to whether the first resistance $R_1$ equals the second resistance $R_2$.

The present invention also provides a method for detecting alignment of deep trench capacitors and word lines in memory devices. In the method of the present invention, a wafer with at least one scribe line region and at least one memory region is provided.

Plurality of pairs of memory cells in the memory region and scribe line region and at least one test device in the scribe line region are formed simultaneously, wherein the memory regions have deep trench capacitors and word lines as shown in FIG. 1 and FIG. 2. The structure of the test device 200 is shown in FIG. 3 and FIG. 4. The deep trench capacitors 10 in the memory and scribe line regions and the bar-type deep trench capacitor (111 and 112) in the test device are formed by the same mask and the same process. The word lines 12 in the memory and scribe line regions are formed by the same mask and the same process. The bit line contacts 22 in the memory and scribe line regions, and the first bit line contact 221 of the test device is formed simultaneously with the same masks and process.

After that, the first resistance $R_1$ between the first bit line contact 221 and the bit line contact 22 of the pair of memory cells 251 is measured by turning on the transistor 141. The second resistance $R_2$ between the first bit line contact 221 and the bit line contact 22 of the pair of memory cells 252 is measured by turning on the transistor 142. Then, alignment of the bar-type deep trench capacitor (111 and 112) and word lines 12 of the test device 200 is determined according to whether the first resistance $R_1$ equals to the second resistance $R_2$.

The memory region and the test device in the scribe line region may have the same alignment shift between deep trench capacitors (10, 111 and 112) and word lines 12 due to use of the same masks and process. Thus, alignment of deep trench capacitors and word lines in memory region can be obtained according to whether the first resistance $R_1$ equals the second resistance $R_2$. The alignment shift $\Delta L$ between deep trench capacitors and word lines in the memory regions can also be obtained according to the equation 4. Further, in the present invention the test device is disposed in the scribe line region to avoid occupying layout space.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for detecting alignment of deep trench capacitors and word lines in DRAM devices, wherein the test device is disposed in a scribe line region of a wafer, the scribe line region having a plurality of pairs of memory cells, each having two deep trench capacitors deposed at two ends of an active area, two word lines disposed above the active area, and a bit line contact disposed between the two word lines and electrically coupled to the active area, the test device comprising:

parallel first and second bar-type deep trenches capacitors disposed in the scribe line region; wherein the first and second bar-type deep trenches capacitors extend to the first and second pairs of memory cells adjacent to the first active area respectively, and are electrically coupled to bit line contacts of the first and second pairs of memory cells respectively;

a first transistor having a source coupled to the first bar-type deep trench capacitor;

a second transistor having a source coupled to the second bar-type deep trench capacitor; and a first bit line contact electrically coupled to drains of the first and second transistors.

2. The test device as claimed in claim 1, wherein two word lines are disposed on two sides of the first bit line contact respectively, as gates of the first and the second transistors respectively.

3. The test device as claimed in claim 2, wherein a first resistance between the first bit line contact and the bit line contact of the first pair of memory cells is detected by turning on the first transistor, and a second resistance between the second bit line contact and the bit line contact of the second pair of memory cells is detected by turning on the second transistor.

4. A semiconductor device with a test device, comprising:

a substrate having a least one scribe line region and a memory region, wherein the scribe line region and the memory region both have a plurality of pairs of memory cells, each including:
an active area;
two deep trench capacitors deposed at two ends of the active area;
two word lines disposed above the active area; and
a bit line contact disposed between the two word lines and electrically coupled to the active area; and a test device disposed in the scribe line region, comprising:
parallel first and second bar-type deep trenches capacitors disposed in the scribe line region; wherein the first and second bar-type deep trenches capacitors extend to the first and second pairs of memory cells adjacent to the first active area respectively, and electrically coupled to bit line contacts of the first and second pairs of memory cells respectively;
a first transistor having a source coupled to the first bar-type deep trench capacitor;
a second transistor having a source coupled to the second bar-type deep trench capacitor; and
a first bit line contact electrically coupled to drains of the first and second transistors.

5. The semiconductor device as claimed in claim 4, wherein two word lines are disposed on two sides of the first bit line contact respectively, as gates of the first and the second transistors respectively.

6. The semiconductor device as claimed in claim 4, wherein a first resistance between the first bit line contact and the bit line contact of the first pair of memory cells is detected by turning on the first transistor, and a second resistance between the second bit line contact and the bit line contact of the second pair of memory cells is detected by turning on the second transistor.

7. A method for detecting alignment of deep trench capacitors and word lines in DRAM devices, comprising:

providing a wafer with at least one scribe line region and at least one memory region;

forming a plurality of pairs of memory cells in the memory region and at least one test device in the scribe line simultaneously, wherein each pair of memory cells includes an active area, two deep trench capacitors deposed at two ends of the active area, two word lines disposed above the active area, and a bit line contact disposed between the two word lines and electrically coupled to the active area, the test device including:

parallel first and second bar-type deep trenches capacitors disposed in the scribe line region; wherein the first and second bar-type deep trenches capacitors extend to the first and second pairs of memory cells adjacent to the first active area respectively, and electrically coupled to bit line contacts of the first and second pairs of memory cells respectively;

a first transistor having a source coupled to the first bar-type deep trench capacitor;

a second transistor having a source coupled to the second bar-type deep trench capacitor; and a first bit line contact electrically coupled to drains of the first and second transistors;

measuring a first resistance between the first bit line contact and the bit line contact of the first pair of memory cells and a second resistance between the second bit line contact and the bit line contact of the second pair of memory cell; and determining alignment of the deep trench capacitors and word lines in the memory regions according to alignment of the first and second resistance.

8. The method as claimed in claim 7, wherein two word lines are disposed on two sides of the first bit line contact respectively, as gates of the first and the second transistors respectively.

9. The method as claimed in claim 8, further comprising:

determining alignment of the first and second bar-type deep trenches capacitors and two word lines of the test device according to the first resistance and the second resistance; and determining alignment of the deep trench capacitors and word lines in the memory regions according to alignment of the first and second bar-type deep trenches capacitors and two word lines of the test device.

* * * * *